United States Patent [19]
Fujiki
[11] 4,265,872
[45] May 5, 1981

[54] PROCESS FOR PRODUCING CRYSTALLINE FIBROUS POTASSIUM TITANATE

[76] Inventor: Yoshinori Fujiki, No. 624 Takezono 3-chome, Sakura-mura, Niihari-gun, Ibaraki-ken, Japan

[21] Appl. No.: 60,735

[22] Filed: Jul. 25, 1979

[51] Int. Cl.[3] .......... C01G 23/00
[52] U.S. Cl. .......... 423/598
[58] Field of Search .......... 423/598

[56] References Cited

U.S. PATENT DOCUMENTS

| | | | |
|---|---|---|---|
| 2,841,470 | 7/1958 | Berry | 423/598 |
| 3,952,090 | 4/1976 | Shimizer et al. | 423/598 |
| 4,041,143 | 8/1977 | Fujiki et al. | 423/598 |
| 4,064,224 | 12/1977 | Kawamata et al. | 423/598 |
| 4,179,496 | 12/1979 | Yanagida et al. | 423/598 |

FOREIGN PATENT DOCUMENTS

| | | | |
|---|---|---|---|
| 51-95999 | 8/1976 | Japan | 423/598 |

*Primary Examiner*—Herbert T. Carter
*Attorney, Agent, or Firm*—Oblon, Fisher, Spivak, McClelland & Maier

[57] ABSTRACT

A crystalline fibrous potassium titanate having the formula $K_2O.6TiO_2$ is produced by melting a mixture of a titanium component and a potassium component; quenching the molten product on a plate; removing the unreacted $K_2O$ and excess $K_2O$ from the quenched product by washing water or an acid; and heat-treating the product to improve crystallinity.

2 Claims, No Drawings

PROCESS FOR PRODUCING CRYSTALLINE FIBROUS POTASSIUM TITANATE

BACKGROUND OF THE INVENTION

1. Field of the Invention

The present invention relates to a process for producing a crystalline fibrous potassium titanate which has excellent heat resistant and heat insulating property.

2. Description of the Prior Art

The inventors have studied and found that fibrous alkali metal titanates can be produced by a flux method wherein a mixture of the components of alkali metal oxide and titanium oxide and a flux is melted and the molten product is cooled and washed with an acid or water to remove the flux. This process is disclosed in U.S. Pat. No. 4,041,143.

However, the flux method has disadvantages that the flux is expensive and the special steps for separating the flux and recovering the flux are required.

SUMMARY OF THE INVENTION

It is an object of the present invention to provide a process for producing a crystalline fibrous potassium titanate without a flux.

Another object of the present invention is to provide a process for producing a crystalline fibrous potassium titanate which has excellent heat resistant and heat insulating property and high strength and desired fibrous form.

The foregoing and other objects of the present invention have been attained by melting a starting material of a mixture of a titanium component and a potassium component at a ratio for forming $K_2O.nTiO_2$ wherein n is 1 to 5 or a potassium titanate having the formula $K_2O.nTiO_2$; quenching the molten product from one side so as to give a temperature gradient from one side to the other side; removing the unreacted potassium component and excess of potassium component from the product; and heating the product at a temperature from 400° C. to lower than the melting point of the product.

DETAILED DESCRIPTION OF THE PREFERRED EMBODIMENTS

The starting materials can be the mixture of the titanium component and the potassium component at a ratio for forming $K_2O.nTiO_2$.

The titanium component is usually titanium oxide, especially anatase form titanium oxide.

The potassium component is usually potassium hydroxide, potassium carbonate, potassium bicarbonate, potassium nitrate. The other titanium component and the other potassium component can be selected, if desire. A small portion of potassium component can be substituted by the other alkali metal component such as a sodium, rubidium or cesium component.

The potassium titanates having the formula $K_2O.nTiO_2$ can be also used as the starting material.

It is preferable to pulverize these component so as to be mixed uniformly before the melting.

The ratio of the potassium component to the titanium component can be selected as desired. The fibrous potassium titanate as the final product may have the formula $K_2O.6TiO_2$, however the potassium component should be used excess so as to form the product having the formula $K_2O.nTiO_2$ (n is 1 to 5 preferably 2 to 4).

The unreacted $K_2O$ or excess potassium component can be removed by washing with water or an acid. When a sodium component is incorporated, most of the sodium component may be removed by the washing with an acid. The acid treatment result in the conversion of the product into $K_2O.6TiO_2$ or like. It is preferable to melt the starting material at relatively lower temperature and to quench the molten product for solidification.

The molten product should be quenched from one side. It is preferable to quench the molten product on a plate which is cooled with water or a coolant so as to give a temperature gradient from one side to the other side whereby a fibrous potassium titanate can be formed in a desired form. If necessary, the molten product can be spun to form the fibrous product, by the method for preparing a glass fiber. When excess of the potassium component is used, the product obtained by solidifying the molten product comprises $K_2O.4TiO_2$ and $K_2O.2TiO_2$ which have laminar structure. $K^+$ ions between the laminar layers can be easily removed by reacting an acid whereby the product having the formula $K_2O.6TiO_2$ is easily formed. The product having the formula $K_2O.6TiO_2$ is easily crystallized by a heat treatment at a temperature lower than the melting point.

The product obtained by quenching the molten product can be directly treated with an acid though it is preferable to wash the product with water before the acid treatment.

The concentration of the acid used for the acid treatment is preferably lower such as 0.01 N-HCl though it is possible to use a relatively high concentration of mineral acid or an organic acid can be used. It is preferable to apply compress stress to the product obtained by quenching the molten product in the direction perpendicular to the fibrous axis whereby the fibrous form of the product is improved to form a fine fibrous product. The compress stress can be applied after wetting the product.

The fibrous potassium titanate formed by the quenching usually has an average length of about 5 mm. and a diameter of 0.01 to 1 mm. The length and the diameter of the fibrous product can be controlled depending upon the incorporation of an additive, the temperature of the heat treatment and the quenching and the stress application etc. In the quenching, the product having the formula $K_2O.4TiO_2$ is firstly formed and then the product having the formula $K_2O.2TiO_2$ is consequently formed, though the formula can be varied. These products have excess potassium component.

According to many experiments it is considered that in the quenching step, the fibrous product having the formula $K_2O.4TiO_2$ is firstly formed and then the unknown layer ($K_2O.2TiO_2$) is subsequently formed and excess $K_2O$ component is a liquid component in the formation of the fibrous product. Excess $K_2O$ may be present as a matrix between the fibrous product. The matrix of excess $K_2O$ prevent the melt bonding of the fibrous product and the fibrous product is easily separated into the fibrous form by washing out excess $K_2O$ component.

It is quite important to convert the product having the formula $K_2O.2TiO_2$ and $K_2O.4TiO_2$ into $K_2O.6TiO_2$ by the acid treatment since the product having the formula $K_2O.6TiO_2$ can be easily crystallized by the heat treatment from 400° C. to the melting point of the product. In order to give a desired fibrous form, the molten product was quenched and accordingly, the crystallinity is low, however the crystallinity can be remarkably increased by the heat treatment of the product having the formula $K_2O.6TiO_2$.

The invention will be further illustrated by certain examples.

EXAMPLE 1

Titanium oxide powder $TiO_2$(anatase) and potassium carbonate powder $K_2CO_3$ were mixed at a molar ratio of 2:1. In a 100 ml. platium crucible, 45 g. of the mixture was filled and heated at 1100° C. for 30 minutes to melt it. The molten product was poured into a 200 ml. metallic cap whose bottom was cooled with water whereby the molten product was quenched so as to transfer heat in one direction. The product was crystallized in a fibrous form having an average length of about 5 mm. as a cake. The product was immersed into water for 1 hour whereby the unreacted $K_2O$ component was dissolved. The product was washed with water and slight compress stress is applied in the direction perpendicular to the fibrous axis to form a fine fibrous potassium titanate which had an average length of about 5 mm. and a diameter of 0.01 to 1 mm. The product was a crystalline form which imparts strong interference fringe in the observation by a polarizing microscope. The dried product was tested by X ray diffraction using a copper electrode. As a result, it was found that the product had broad peaks at $\theta=11°$, 29° and 48° and accordingly the product had relatively low crystallinity.

The resulting fibrous potassium titanate (10 g.) was immersed into 100 ml. of 0.01 N-HCl with stirring for 1 hour to remove $K_2O$ component from the fibrous product, and the resulting product wash washed with water and separated by a filtration to obtain the product having intermediate phase. The product was further heated at 900° C. for 1 hour to obtain a fibrous potassium titanate having the formula $K_2O.6TiO_2$ which had high crystallinity.

I claim:

1. In a process for producing a crystalline fibrous potassium titanate which comprises:

(a) melting a mixture of a titanium component and a potassium component in a ratio such that the product has the formula $K_2O.nTiO_2$ wherein n is an integer of 1 to 5;

(b) quenching the molten product;

(c) washing the quenched product with water; and (d) re-heating the product at a temperature lower than its melting point thereby forming fibers therein, the improvements comprising quenching the molten product in a vessel which is cooled from one side to give a temperature gradient from said side to the opposite side to transfer heat in one direction, applying compress stress to the product perpendicular to the fibrous axis during the washing step and treating the washed product with an acid thereby forming potassium titanate having the formula $K_2O.6TiO_2$.

2. An improved process in accordance with claim 1, wherein the ratio of the titanium component and the potassium component in the starting material is 2:1.

* * * * *